United States Patent

Matsumoto et al.

[11] Patent Number: 5,168,126
[45] Date of Patent: Dec. 1, 1992

[54] CONTAINER PACKAGE FOR SEMICONDUCTOR ELEMENT

[76] Inventors: Hiroshi Matsumoto; Hiroaki Inokuchi, both of c/o Kyocera Corporation, 1-1, Yamashita-cho, Kokhbu-shi, Kagoshima-ken, Japan

[21] Appl. No.: 574,472

[22] Filed: Aug. 27, 1990

[30] Foreign Application Priority Data

| Aug. 25, 1989 | [JP] | Japan | 1-219228 |
| Nov. 27, 1989 | [JP] | Japan | 1-308593 |
| Nov. 27, 1989 | [JP] | Japan | 1-308594 |
| Nov. 27, 1989 | [JP] | Japan | 1-308601 |
| Nov. 27, 1989 | [JP] | Japan | 1-308603 |
| Nov. 27, 1989 | [JP] | Japan | 1-308604 |
| Nov. 27, 1989 | [JP] | Japan | 1-308605 |
| Nov. 27, 1989 | [JP] | Japan | 1-308606 |
| Nov. 27, 1989 | [JP] | Japan | 1-308610 |
| Nov. 27, 1989 | [JP] | Japan | 1-308615 |
| Nov. 28, 1989 | [JP] | Japan | 1-308617 |
| Nov. 30, 1989 | [JP] | Japan | 1-312722 |
| Nov. 30, 1989 | [JP] | Japan | 1-312723 |
| Nov. 30, 1989 | [JP] | Japan | 1-312727 |
| Nov. 30, 1989 | [JP] | Japan | 1-312731 |
| Nov. 30, 1989 | [JP] | Japan | 1-312732 |

[51] Int. Cl.$^5$ .......................................... H01L 23/02
[52] U.S. Cl. .................................. 174/52.4; 357/678
[58] Field of Search ............... 174/52.1, 52.2, 52.3, 174/52.4; 501/55, 53, 60; 420/8, 15, 34; 437/220; 357/70, 74

[56] References Cited

U.S. PATENT DOCUMENTS

| 4,262,165 | 4/1981 | Ohwaki et al. | 174/524 |
| 4,752,334 | 6/1988 | Nadkarni et al. | 75/235 |
| 4,821,151 | 4/1989 | Prior et al. | 361/403 |
| 5,015,803 | 5/1991 | Mahulikar et al. | 174/52.4 |

FOREIGN PATENT DOCUMENTS 1108795 4/1989 Japan .

Primary Examiner—Leo P. Picard
Assistant Examiner—Bot Lee Ledynh

[57] ABSTRACT

Disclosed is a container package for a semiconductor element, which comprises a vessel having in the interior thereof a space for containing a semiconductor element, which comprises an insulating substrate and a lid member, an external lead terminal for connecting the semiconductor element contained in the vessel to an electric circuit and a sealing agent for sealing the vessel and external lead terminal, wherein the external lead terminal is composed of an electroconductive material having a thermal expansion coefficient of from $5 \times 10^{-6}$ to $12 \times 10^{-6}/°C$. and an electroconductivity of at least 10% (International Annealed Copper Standard).

8 Claims, 1 Drawing Sheet

CONTAINER PACKAGE FOR SEMICONDUCTOR ELEMENT

BACKGROUND OF THE INVENTION (1) Field of the Invention

The present invention relates to an improvement in a package for containing a semiconductor element.

(2) Description of the Related Art

A conventional package for containing a semiconductor element, especially a glass-sealed semiconductor container package sealed by fusion bonding of a glass, comprises an insulating vessel having in the interior thereof a space for containing a semiconductor element, which comprises an insulating vessel and a lid member, and an external lead terminal for electrically connecting the semiconductor element contained in the vessel to an external electric circuit. In this package, a sealing glass material member is attached to each of confronting main surfaces of the insulating substrate and lid member, the external lead terminal is fixed to the main surface of the insulating substrate, respective electrodes of the semiconductor element are wire-bonded and connected to the external lead terminal, and the glass material members fusion-bonded to the insulating substrate and lid member are melted and integrated to seal the semiconductor element in the interior air-tightly.

In the conventional glass-sealed semiconductor element container package, the external lead terminal is composed of an electroconductive material such as Kovar (an alloy comprising 29% by weight of Ni, 16% by weight of Co and 55% by weight of Fe) or 42 Alloy (an alloy comprising 42% by weight of Ni and 58% by weight of Fe), but since Kovar or 42 Alloy has a low electroconductivity, Kovar or 42 Alloy has defects as described below.

(1) Kovar or 42 Alloy has such a low electroconductivity as 3.0 to 3.5% (IACS). Accordingly, when a signal is transmitted through the external terminal composed of Kovar or 42 Alloy, the signal-transmitting speed is extremely low and a semiconductor element of the high-speed driving type cannot be contained.

(2) With increase of the density and integration degree of the semiconductor element to be contained in the semiconductor container package, the number of electrodes of the semiconductor elements increases drastically, and the width of the external lead terminal for connecting respective electrodes of the semiconductor element to the external electric circuit is much reduced. Because of this reduction of the width of the external lead terminal as well as the low electroconductivity of Kovar or 42 Alloy described in (1) above, the electric resistance becomes very large. When a signal is transmitted through the external lead terminal, because of this large electric resistance of the external lead terminal, the signal is greatly attenuated, and it is impossible to put the signal precisely into the semiconductor element contained in the interior and a malfunction is caused in the semiconductor element.

SUMMARY OF THE INVENTION

The present invention is to overcome the foregoing defects of the conventional technique, and it is a primary object of the present invention to provide a container package for a semiconductor element, in which attenuation of a signal in the external lead terminal is controlled to a minimum level, and the input of the signal into the semiconductor element contained in the interior and the output of the signal therefrom can be performed precisely, whereby the semiconductor element can be operated normally and stably over a long period.

Another object of the present invention is to provide a semiconductor element container package, in which a semiconductor element to be driven at a high speed can be contained.

In accordance with the present invention, there is provided a container package for a semiconductor element, which comprises a vessel having in the interior thereof a space for containing a semiconductor element, which comprises an insulating substrate and a lid member, an external lead terminal for connecting the semiconductor element contained in the vessel to an external electric circuit and a sealing agent for sealing the vessel and external lead terminal, wherein the external lead terminal is composed of an electroconductive material having a thermal expansion coefficient of from $5 \times 10^{-6}$ to $12 \times 10^{-6}/°$ C. and an electroconductivity of at least 10% (International Annealed Copper Standard).

DETAILED DESCRIPTION OF THE PREFERRED EMBODIMENTS

Figure 1:
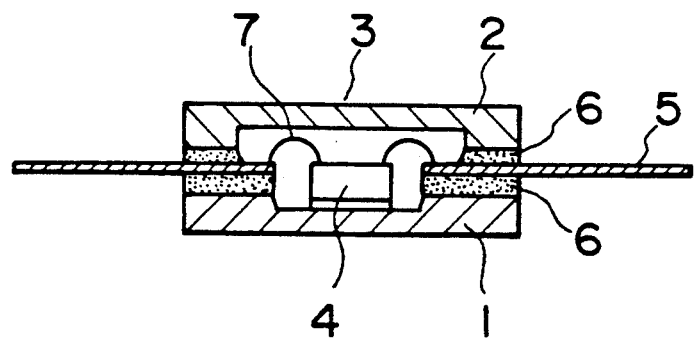
FIG. 1 is a sectional view illustrating one embodiment of the semiconductor element container package of the present invention.
Figure 2:
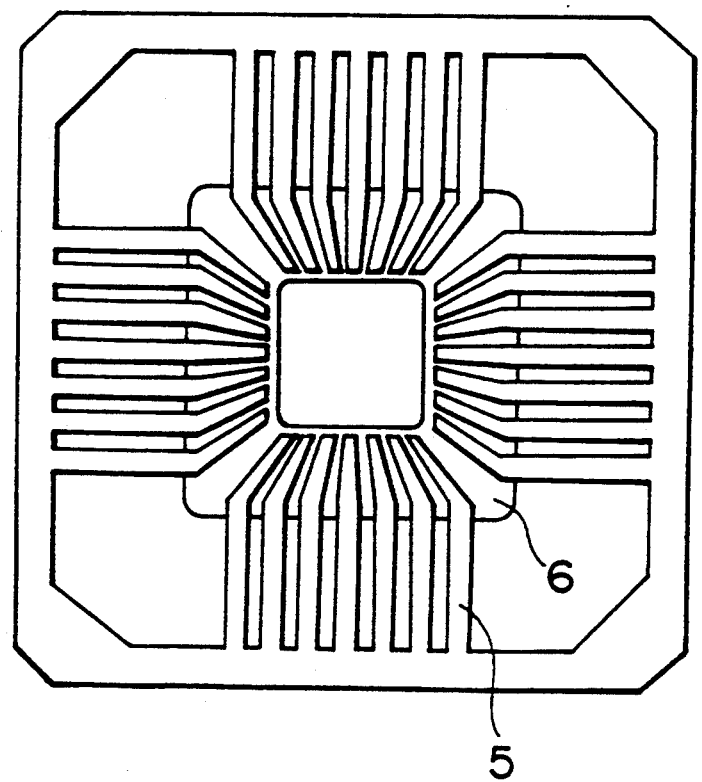
FIG. 2 is a plane view of the package of FIG. 1, seen from the top surface of the insulating substrate.

Referring to FIGS. 1 and 2 illustrating the embodiment of the semiconductor element container package of the present invention, this package comprises an insulating vessel 3 which is constructed by an insulating substrate 1 and a lid member 2.

A recess for forming a space for containing a semiconductor element is formed at a central part of each of the insulating substrate 1 and lid member 2, and a semiconductor element 4 is attached and fixed to the bottom face of the recess of the insulating substrate 1 through an adhesive such as a resin, a glass or a solder.

The insulating substrate 1 and lid member 2 are composed of optional ceramics such as alumina ceramics, mullite ceramics, zirconia ceramics, silicon carbide ceramics and forsterite ceramics, and the substrate 1 and lid member 2 are formed by filling a starting ceramics powder into a press mold having a shape corresponding to the shape of the insulating substrate 1 and lid member 2, applying a predetermined pressure to the filled powder to mold the powder and firing the molded body at a firing temperature inherent to the ceramics used.

The ceramics constituting the insulating substrate 1 and lid member 2 is selected so that no great difference of the thermal expansion coefficient is produced between the insulating substrate 1 and lid member 2 and a sealing glass material member described hereinafter.

A sealing glass material member 6 is bonded to each of the confronting main surfaces of the insulating substrate 1 and lid member 2 in advance, and the sealing glass material members 6 bonded to the insulating substrate 1 and lid member 2 are heated and melted to effect integration, whereby the semiconductor element 4 in the insulating vessel 3 is air-tightly sealed. If the thermal expansion coefficient of the sealing glass material member 6 is made close to that of the insulating substrate 1 and lid member 2, when the semiconductor element 4 in the insulating vessel 3 is air-tightly sealed by heat-melting and integrating the sealing glass material members 6 bonded to the insulating substrate 1 and lid member 2, a thermal stress by the difference of the thermal expansion coefficient between the insulating substrate 1 and lid member 2 and the sealing glass material member 6 is not substantially caused, and the insulating substrate 1 and lid member 2 can be tightly bonded to each other through the sealing glass material member 6.

The sealing glass material member 6 is coated and bonded onto the confronting main surfaces of the insulating substrate 1 and lid member 2, for example, by applying a glass paste formed by adding an appropriate solvent and an appropriate medium to a glass powder such as a powder of a lead borosilicate glass according to a known thick film-forming method.

An external lead terminal 5 composed of an electroconductive material is arranged between the insulating substrate 1 and the lid member 2, and respective electrodes of the semiconductor element 4 are electrically connected to the external terminal 5 through a wire 7, and the semiconductor element 4 is connected to an external electric circuit by connecting the external lead terminal 5 to the external electric circuit.

When the sealing glass material members 6 coated and bonded to the confronting main surfaces of the insulating substrate 1 and lid member 2 are melted and integrated to seal the insulating vessel 3 air-tightly, the external lead terminal 5 is simultaneously attached between the insulating substrate 1 and lid member 2.

It is important that the external lead terminal 5 should be composed of an electroconductive material having an electroconductivity of at least 10% (IACS) and a thermal expansion coefficient of from $5 \times 10^{-6}$ to $12 \times 10^{-6}/°$ C.

Since the electroconductivity of the external lead terminal 5 is at least 10% (IACS) and an electric current flows easily through the external lead terminal 5, the signal-transmitting speed of the external lead terminal 5 can be increased to a very high level. Accordingly, even if the semiconductor element 4 is driven at a high speed, transmission and transfer of the signal between the semiconductor element 4 and the external electric circuit can always be performed stably and assuredly.

Moreover, since the electroconductivity of the external lead terminal 5 is high, even if the line width of the external lead terminal 5 is reduced, the electric resistance of the external lead terminal 5 can be controlled to a low level, with the result that attenuation of the signal in the external lead terminal 5 can be minimized and an electric signal supplied from the external electric circuit can be precisely put into the semiconductor element 4.

Still further, since the thermal expansion coefficient of the external lead terminal 5 is from $5 \times 10^{-6}$ to $12 \times 10^{-6}/°$ C. and is close to that of the sealing glass material member 6, when the external lead terminal 5 is fixed between the insulating substrate 1 and the lid member 2, a stress owing to the difference of the thermal expansion coefficient is not generated between the external lead terminal 5 and the sealing glass material member 6, and therefore, the external lead terminal 5 can be tightly fixed by the sealing glass member material 6.

According to the present invention, the semiconductor element 4 is attached and fixed to the bottom face of the recess of the insulating substrate 1 and respective electrodes of the semiconductor element 4 are connected to the external lead terminal 5 through the bonding wire 7, and then, the insulating substrate 1 and the lid member 2 are bonded to each other by melting and integrating the sealing glass material members 6 coated and bonded in advance to the confronting main surfaces of the insulating substrate 1 and the lid member 2, whereby a semiconductor device as a final product is completed.

External lead terminals preferably used in the present invention and combinations thereof with the substrate and lid member ceramics and the glass sealing agent will now be described in detail.

External Lead Terminal (I)

This terminal comprises a core composed of copper, the outer surface of which is cladded with a cladding layer composed of an alloy comprising 51.5 to 52.5% by weight of nickel and 47.5 to 48.5% by weight of iron, and in this metal body, the sectional area of the cladding layer is 7.2 to 8.8 times as large as the sectional area of the core and this metal body has an electroconductivity of 14.8% (IACS) and a thermal expansion coefficient of about $100 \times 10^{-7}$.

This external lead terminal 16 formed by pressure-welding a nickel-iron alloy (Ni-Fe alloy) to the outer surface of an ingot of copper (Cu) and rolling the pressure-welded body. In this external lead terminal, if the amounts of nickel (Ni) and iron (Fe) and the sectional areas of the core and cladding layer are outside the above-mentioned ranges, the electroconductivity is not increased to a desired large value, and the thermal expansion coefficient of the external lead terminal cannot be made in agreement with that of the insulating substrate and lid member.

As the ceramics suitably combined with the above-mentioned external lead terminal, especially the terminal (I), there can be mentioned a forsterite sintered body and a zirconia sintered body. A sintered body of this type is prepared by filling starting material powders such as magnesia (MgO) and silica ($SiO_2$) in case of the forsterite sintered body or starting material powders such as zirconium oxide ($ZrO_2$) and yttria ($Y_2O_3$) in case of the zirconia sintered body into a press mold having a shape corresponding to the insulating substrate 1 and lid member 2, applying a predetermined pressure to the filled powder and firing the molded body at a temperature of about 1200° to about 1500° C.

The thermal expansion coefficient of the forsterite sintered body or zirconia sintered body constituting the insulating substrate 1 and lid member 2 is $95 \times 10^{-7}$ to $110 \times 10^{-7}/°$ C., which is not substantially different from that of the sealing glass material member described below, and therefore, no substantial difference of the thermal expansion is brought about between the insulating substrate 1 and lid member 2 and the sealing glass material member.

The following sealing agents (A), (B) and (C) are preferably used as the member for sealing the above-mentioned terminals and ceramics.

Sealing Agent (A)

This sealing agent consists of a glass formed by adding up to 15% by volume of at least one member selected from the group consisting of lead titanate, aucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (A) as the glass material member 6 is $90 \times 10^{-7}$ to $120 \times 10^{-7}/°C$. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 0.3% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTLO_3$), eucryptite ($LiAl_2Si_2O_8$), cordierite ($Mg_2AL_4Si_5O_{18}$), zircon ($ZrSiO_4$), tin oxide ($SnO_2$), willemite ($Zn_2SiO_4$) and tin titanate ($Sn_4SiO_4$), which is added as the filler, exceeds 15% by volume, the thermal expansion is not in agreement with the thermal expansion of the insulating substrate 1 and the lid member 2.

Sealing Agent (B)

This sealing agent consists of a glass comprising 30.0 to 60.0% by weight of silica, 20.0 to 40.0% by weight of lead oxide and 10.0 to 20.0% by weight of at least one member selected from the group consisting of oxides of sodium and potassium. The sealing agent (B) is prepared by weighting and mixing the foregoing components so as to attain a desired composition and heat-melting the powdery mixture at a temperature of 1300° to 1400° C.

The thermal expansion coefficient of this glass material member is $110 \times 10^{-7}$ to $130 \times 10^{-7}/°C$. Since this thermal expansion coefficient is approximate to the thermal expansion coefficient of the above-mentioned ceramics, no thermal stress is generated.

If the content of silica ($SiO_2$) in this sealing glass material is lower than 30.0% by weight, crystallization of the glass is advanced and air-tight sealing of the insulating vessel 3 is difficult. If the content of silica exceeds 60.0% by weight, the thermal expansion of the glass is reduced and is not in agreement with the insulating substrate 1 and lid member 2.

In this glass, if the content of lead oxide (PbO) is lower than 20.0% by weight, the thermal expansion of the glass becomes small and is not in agreement with that of the insulating substrate 1 and lid member 2. If the content of lead oxide exceeds 40.0% by weight, crystallization of the glass is advanced and air-tight sealing of the insulating vessel 3 is difficult.

If the content of the oxide of the sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

Sealing Agent (C)

This sealing agent consists of a glass comprising 60.0 to 70.0% by weight of silica, 10.0 to 20.0% by weight of at least one member selected from the group consisting of oxides of sodium and potassium and 5.0 to 15.0% by weight of borium oxide. The sealing agent (C) is prepared by weighing and mixing the foregoing components so as to attain a desired composition and heat-melting the powdery mixture at a temperature of 1300° to 1400° C. The thermal expansion coefficient of this glass material member is $9 \times 10^{-7}$ to $100 \times 10^{-7}/°C$. Since this thermal expansion coefficient is approximate to the thermal expansion coefficient of the above-mentioned ceramics, no thermal stress is generated.

If the content of silica ($SiO_2$) in this sealing glass material is lower than 60.0% by weight, crystallization of the glass is advanced and air-tight sealing of the insulating vessel 3 is difficult. If the content of silica exceeds 70.0% by weight, the thermal expansion of the glass is reduced and is not in agreement with the insulating substrate 1 and lid member 2.

If the content of the oxide of sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

If the content of barium oxide (BaO) is lower than 5.0% by weight, the chemical resistance of the glass is degraded and the reliability of air-tight sealing of the insulation vessel is drastically reduced. If the content of barium oxide exceeds 15.0% by weight, crystallization of the glass is advanced and air-tight sealing of the insulating vessel is difficult.

As another preferred examples of the external terminal, the following can be mentioned.

External Lead Terminal (II)

This terminal is composed of a metal body formed by cladding the outer surface of a core composed of an alloy comprising 41.5 to 42.5% by weight of nickel and 57.5 to 58.5% by weight of iron with a cladding layer of copper, the sectional area of the copper layer being 20 to 40% of the sectional area of the core. This external lead terminal has an electroconductivity of 27.2% (IACS) and a thermal expansion coefficient of about $49 \times 10^{-7}/°C$.

This external lead terminal 5 is formed by pressure-welding copper (Cu) to the outer surface of an ingot of a nickel iron alloy (Ni-Fe alloy) and rolling the welded body.

If the amounts of Nickel (Ni) and iron (Fe) in this external lead terminal 5 and the sectional areas of the core and cladding layer are outside the above-mentioned ranges, the electroconductivity is not increased to a desired large value, and the thermal expansion coefficient of the external lead terminal is not in agreement with that of the insulating substrate and lid member.

As the sintered body preferably combined with the above-mentioned terminal (II), there can be mentioned an aluminum nitride sintered body, a mullite sintered body and a zircon sintered body. A sintered body of this type is prepared by filling starting material powders such as aluminum nitride (AlN) and yttria ($Y_2O_3$) in case of the aluminum nitride sintered body, starting material powders such as alumina ($Al_2O_3$) and silica ($SiO_2$) in case of the mullite sintered body or starting material powders such as zirconium oxide ($ZrO_2$) and silica ($SiO_2$) in case of the zircon sintered body in a press mold having a shape corresponding to the insulating substrate 1 and lid member 2, applying a predetermined pressure to the filled starting materials and firing the molded body at a temperature of about 1300° to about 1800° C.

The thermal expansion coefficient of the aluminum nitride sintered body, mullite sintered body or zircon sintered body constituting the insulating substrate 1 and lid member 2 has a thermal expansion coefficient of $40 \times 10^{-7}$ to $50 \times 10^{-7}/°C$., and this thermal expansion coefficient is not substantially different from that of the sealing glass material member described hereinafter and no substantial difference of the thermal expansion is brought about between the insulating substrate 1 and lid member 2 and the sealing glass material member.

The following sealing agents (D), (E) and (F) are preferably used for sealing the above-mentioned external lead terminal (II) and the above-mentioned ceramics.

Sealing Agent (D)

This sealing agent consists of a glass comprising 65.0 to 80.0% by weight of silica, 10.0 to 25.0% by weight of boron oxide, 1.0 to 10.0% by weight of alumina and 1.0 to 10.0% by weight of at least one member selected from oxides of sodium and potassium, and this sealing agent is prepared by weighing and mixing the above components so as to attain a desired composition and heat-melting the powdery mixture at a temperature of 1500° to 1600° C. The thermal expansion coefficient of this sealing agent (6) as the glass material member 6 is $30 \times 10^{-7}$ to $45 \times 10^{-7}/°C$. This thermal expansion coefficient is approximate to that of the above-mentioned ceramics, and any thermal stress is not cause.

If the content of silica ($SiO_2$) is lower than 65.0% by weight, crystallization of the glass is advanced and air-tight sealing of the insulating vessel 3 is difficult, and if the content of silica exceeds 80.0% by weight, the thermal expansion of the glass becomes small and is not in agreement with that of the insulating substrate 1 and lid member 2.

If the content of boron oxide ($B_2O_3$) is lower than 10% by weight, crystallization of the glass is advanced and air-tight sealing of the insulating vessel 3 is difficult. If the content of boron oxide exceeds 25.0% by weight, the chemical resistance of the glass is degraded and the reliability of air-tight sealing of the insulating vessel 3 is drastically reduced.

If the content of alumina ($Al_2O_3$) is lower than 1.0% by weight, the chemical resistance of the glass is reduced and the reliability of air-tight sealing of the insulating vessel 3 is drastically reduced, and if the content of alumina exceeds 10.0% by weight, the thermal expansion of the glass is reduced and is not in agreement with the thermal expansion of the insulating substrate 1 and lid member 2.

If the content of the oxide of sodium or potassium is lower than 1.0% by weight, when the glass is prepared, the melting temperature is drastically elevated and the operation adaptability is drastically degraded. If the content of the oxide of sodium or potassium exceeds 10.0% by weight, the chemical resistance of the glass is degraded and the reliability of air-tight sealing of the insulating vessel 3 is drastically reduced.

Sealing Agent (E)

This sealing agent consists of a glass formed by adding 30.0 to 50.0% by volume of at least one member selected from the group consisting of lead titanate, eucryptie, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (E) as the glass material member 6 is $40 \times 10^{-7}$ to $60 \times 10^{-7}/°C$. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTiO_3$), β-aucryptite ($LiAl_2Si_2O_8$), cordierito ($Mg_2Al_4Si_5O_{18}$), zircon ($ZrSiO_4$), tin oxide ($SnO_2$), willemite ($Zn_2SiO_4$) and tin titanate ($Sn_4SiO_4$), which is added as the filler, is smaller than 30% by volume or larger than 50.0% by volume, the thermal expansion is not in agreement with the thermal expansion of the insulating substrate 1 and the lid member 2.

Sealing Agent (F)

This sealing agent consists of a glass comprising 55.0 to 65.0% by weight of zinc oxide, 15.0 to 25.0% by weight of boron oxide and 10.0 to 15.0% by weight of silica. The sealing agent (F) is prepared by weighting and mixing the foregoing components so as to attain a desired composition and heat-melting the powdery mixture at a temperature of 1200° to 1300° C. The thermal expansion coefficient of this glass material member is $30 \times 10^{-7}$ to $50 \times 10^{-7}$/°C. Since this thermal expansion coefficient is approximate to the thermal expansion coefficient of the above-mentioned ceramics, no thermal stress is generated.

In this sealing glass, if the content of zinc oxide (ZnO) is lower than 55.0% by weight, vitrification becomes difficult and the glass bails to exert the function as the sealing glass material member 6. If the content of zinc oxide exceeds 65.0% by weight, crystallization of the glass is advanced and air-tight sealing of the insulating vessel 3 is difficult.

If the content of boron oxide ($B_2O_3$) is lower than 15% by weight, crystallization of the glass is advanced and air-tight sealing of the insulating vessel 3 is difficult. If the content of boron oxide exceeds 25.0% by weight, the chemical resistance of the glass is degraded and the reliability of air-tight sealing of the insulating vessel 3 is drastically reduced.

If the content of silica ($SiO_2$) is lower than 10.0% by weight, crystallization of the glass is advanced and air-tight sealing of the insulating vessel 3 is difficult, and if the content of silica exceeds 15.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

As another example of the external lead terminal, the following can be mentioned.

External Lead Terminal (III)

This external lead terminal is composed of a metal body formed by bonding a copper plate to upper and lower surfaces of a plate member composed of an invar alloy, the thickness of the copper plate being 15 to 40% of the thickness of the plate member, and this external lead material has an electroconductivity of about 40% (IACS) and a thermal expansion coefficient of about $65 \times 10^{-7}$/°C.

This external lead terminal is formed by oressure-welding a copper (Cu) plate to upper and lower surfaces of an invar alloy (alloy comprising 36.5% by weight of Ni and 63.5% by weight of Fc) and rolling the welding body.

If the thicknesses of the plate member and copper plate are outside the above-mentioned ranges, the electroconductivity is not increased to a desired large value, and the thermal expansion coefficient of the external lead terminal is not in agreement with that of the insulating substrate and lid member.

An aluminum oxide sintered body is preferably used in combination with the above-mentioned terminal (III). This sintered body is prepared by liling powders of starting materials such as aluminum oxide ($Al_2O_3$), silica ($SiO_2$) and magnesia (MgO) into a press mold having a shape corresponding to the insulating substrate 1 and lid member 2, applying a predetermined pressure to the filled powder and firing the molded body at a temperature of about 1500° C.

The thermal expansion coefficient of the aluminum oxide sintered body constituting the insulating substrate 1 and lid member 2 is $65 \times 10^{-7}$ to $75 \times 10^{-7}$/°C., which is not substantially different from that of the sealing glass material member described below, and therefore, no substantial difference of the thermal expansion is brought about between the insulating substrate 1 and lid member 2 and the sealing glass material member.

The following sealing agents (G), (II) and (I) are preferably used as the member for sealing the above-mentioned terminals and ceramics.

Sealing Agent (G)

This sealing agent consists of a glass formed by adding 20 to 40% by volume of at least one member selected from the group consisting of lead titanate, -eucyptite, corduerute, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (K) as the glass material member 6 is $50 \times 10^{-7}$ to $70 \times 10^{-7}$/°C. Since this thermal expansion coefficient of the sealing glass material member 6 is approximate to that of the insulating substrate 1 and member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount added of the filler is smaller than 20% by volume or larger than 40% by volume, the thermal expansion of the glass is not in agreement with that of the insulating substrate 1 and lid member 2.

Sealing Agent H

This sealing glass material member is composed of a glass comprising 30.0 to 50.0% by weight of silica, 10.0 to 30.0% by weight of lead oxide, 5.0 to 15.0% by weight of boron oxide, 5.0 to 15.0% by weight of barium oxide, 5.0 to 10.0% by weight of bismuth oxide, 1.0 to 10.0% by weight of alumina and up to 10.0% by weight of calcia. This sealing glass material member is prepared by weighing and mixing the foregoing components so as to attain a desired composition and heat-melting the powdery mixture at a temperature of 1300° to 1400° C. The thermal expansion coefficient of this glass material member is $55 \times 10^{-7}$ to $70 \times 10^{-7}$/°C., which is close to that of the sintered body.

If the content of silica ($SiO_2$) is lower than 30.0% by weight, crystallization of the glass is advanced and air-tight sealing of the insulating vessel 3 is difficult, and if the content of silica exceeds 50.0% by weight, the thermal expansion of the glass is reduced and is not in agreement with the insulating substrate 1 and lid member 2.

In this glass, if the content of lead oxide (PbO) is lower than 10.0% by weight, the thermal expansion of the glass becomes small and is not in agreement with that of the insulating substrate 1 and lid member 2. If the content of lead oxide exceeds 30.0% by weight, the chemical resistance of the glass is degraded and the reliability of air-tight sealing of the insulating vessel 3 is drastically reduced.

If the content of boron oxide ($B_2O_3$) is lower than 5.0% by weight, crystallization of the glass is advanced and air-tight sealing of the insulating vessel 3 is difficult. If the content of boron oxide exceeds 15.0% by weight, the chemical resistance of the glass is degraded and the reliability of air-tight sealing of the insulating vessel 3 is drastically reduced.

If the content of barium oxide (BaO) is lower than 5.0% by weight, the chemical resistance of the glass is degraded and the reliability of air-tight sealing is drastically reduced. If the content of barium oxide exceeds 15.0% by weight, crystallization of the glass is advanced and air-tight sealing of the insulating vessel becomes difficult.

If the content of bismuth oxide ($Bi_2O_3$) is lower than 5.0% by weight, crystallization of the glass is advanced and air-tight sealing of the insulating vessel 3 becomes difficult. If the content of bismuth oxide exceeds 10.0% by weight, the chemical resistance of glass is degraded and the reliability of air-tight sealing of the insulating vessel 3 is drastically reduced.

If the content of alumina ($Al_2O_3$) is lower than 1.0% by weight, the chemical resistance of the glass is degraded and the reliability of air-tight sealing of the insulating vessel 3 is drastically reduced. If the content of alumina exceeds 10.0% by weight, the thermal expansion of the glass becomes small and is not in agreement with that of the insulating substrate 1 and lid member 2.

If the content of calcia (CaO) exceeds 10% by weight, the chemical resistance of the glass is degraded and the reliability of air-tight sealing of the insulating vessel is drastically reduced.

Sealing Agent (I)

This sealing glass material member is composed of a glass comprising 60.0 to 80.0% by weight of lead oxide, 5.0 to 20.0% by weight of boron oxide, 5.0 to 20.0% by weight of zinc oxide, 1.0 to 10.0% by weight of silica and 1.0 to 10.0% by weight of alumina. This sealing agent is prepared by weighing and mixing the foregoing components so as to attain a desired composition and heat-melting the powdery mixture at a temperature of 1000° to 1100° C. The thermal expansion coefficient of this glass material member is $70 \times 10^{-7}$ to $95 \times 10^{-7}$/°C. Since this thermal expansion coefficient is approximate to the thermal expansion coefficient of the above-mentioned sintered ceramics, no thermal stress is generated.

In this glass, if the content of lead oxide (PbO) is lower than 60.0% by weight, the thermal expansion of the glass becomes small and is not in agreement with that of the insulating substrate 1 and lid member 2. If the content of lead oxide exceeds 80.0% by weight, the chemical resistance of the glass is degraded and the reliability of air-tight sealing of the insulating vessel 3 is drastically reduced.

If the content of boron oxide ($B_2O_3$) is lower than 5.0% by weight, crystallization of the glass is advanced and air-tight sealing of the insulating vessel 3 is difficult. If the content of boron oxide exceeds 20.0% by weight, the chemical resistance of the glass is degraded and the reliability of air-tight sealing of the insulating vessel 3 is drastically reduced.

In this sealing glass, if the content of zinc oxide (ZnO) is lower than 0.5% by weight, vitrification becomes difficult and the glass fails to exert the function as the sealing glass material member 6. If the content of zinc oxide exceeds 20.0% by weight, crystallization of the glass is advanced and air-tight sealing of the insulating vessel 3 is difficult.

If the content of silica (SiO$_2$) in this sealing glass material is lower than 1.0% by weight, crystallization of the glass is advanced and air-tight sealing of the insulating vessel 3 is difficult. If the content of silica exceeds 10% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of alumina (Al$_2$O$_3$) is lower than 1.0% by weight, crystallization of the glass is advanced and air-tight sealing of the insulating vessel 3 is difficult, and if the content of alumina exceeds 10.0% by weight, the thermal expansion of the glass is reduced and is not in agreement with the thermal expansion of the insulating substrate 1 and lid member 2.

As still another example of the external lead terminal, the following external lead terminal can be mentioned.

External Lead Terminal (IV)

This external lead terminal is composed of a metal body formed by bonding a copper plate to upper and lower surfaces of a plate member composed of an invar alloy, the thickness of the copper plate being 10 to 20% of the thickness of the plate member, and this external lead material has an electroconductivity of 21.7% (IACS) and a thermal expansion coefficient of about $40 \times 10^{-7}/°C$.

This external lead terminal is formed by pressurewelding a copper (Cu) plate to upper and lower surfaces of an invar alloy (alloy comprising 36.5% by weight of Ni and 63.5% by weight of Fe) and rolling the welding body.

If the thickness of the plate member and copper plate are outside the above-mentioned ranges, the electroconductivity is not increased to a desired large value, and the thermal expansion coefficient of the external lead terminal is not in agreement with that of the insulating substrate and lid member.

A silicon carbide sintered body is preferably used in combination with the above-mentioned terminal (IV). This sintered body is prepared by filing powders of starting materials such as silicon carbide (SiC) and beryllia (BeO) into a press mold having a shape corresponding to the insulating substrate 1 and lid member 2, applying a predetermined pressure to the filled powder and firing the molded body at a temperature of about 2000° to about 2200° C.

The thermal expansion coefficient of the silicon carbide sintered body constituting the insulating substrate 1 and lid member 2 is $30 \times 10^{-7}$ to $40 \times 10^{-7}/°C$, which is not substantially different from that of the sealing glass material member described below, and therefore, no substantial difference of the thermal expansion is brough about between the insulating substrate 1 and lid member 2 and the sealing glass material member.

The following sealing agents (J) and (K) are preferably used as the member for sealing the above-mentioned terminals and ceramics.

This sealing glass material member is composed of a glass comprising 55.0 to 65.0% by weight of zinc oxide, 15.0 to 25.0% by weight of boron oxide and 10.0 to 15.0% by weight of silica. This sealing glass material member is prepared by weighing and mixing the foregoing components so as to attain a desired composition and heat-melting the powdery mixture at a temperature of 1200° to 1300° C. The thermal expansion coefficient of this glass material member is $30 \times 10^{-7}$ to $50 \times 10^{-7}/°C$, which is close to that of the sintered body.

In this sealing glass member 6, if the content of zinc oxide (ZnO) is lower than 55.0% by weight, vitrification is difficult and the function of the member 6 is lost, and if the content of zinc oxide exceeds 65.0% by weight, crystallization of the glass is advanced and air-tight sealing of the insulating vessel 3 is difficult.

If the content of boron oxide (B$_2$O$_3$) is lower than 15.0% by weight, crystallization of the glass is advanced and air-tight sealing of the insulating vessel 3 is difficult, and if the content of boron oxide exceeds 25.0% by weight, the chemical resistance of the glass is degraded and the reliability of air-tight sealing of the insulating vessel is drastically reduced.

If the content of silica (SiO$_2$) is lower than 10% by weight, crystallization of the glass is advanced and air-tight sealing of the insulating vessel is difficult, and if the content of silica exceeds 15.0% by weight, when the external lead terminal 5 is attached to the insulating vessel 3 through the glass member 6, the melting temperature of the glass is elevated and thermal deterioration of the semiconductor element contained in the insulating vessel 3 is caused.

Sealing Agent (K)

This sealing glass material member is composed of a glass comprising 65.0 to 80.0% by weight of silica, 10.0 to 25.0% by weight of boron oxide, 1.0 to 10.0% by weight of alumina and 1.0 to 10.0% by weight of at least one member selected from oxides of sodium and potassium. This sealing agent is prepared by weighing and mixing the foregoing components so as to attain a desired composition and heat-melting the powdery mixture at a temperature of about 1500° to about 1600° C. The thermal expansion coefficient of this glass material member is $30 \times 10^{-7}$ to $45 \times 10^{-7}/°C$. Since this thermal expansion coefficient is approximate to the thermal expansion coefficient of the above-mentioned sintered ceramics, no thermal stress is generated.

If the content of silica (SiO$_2$) in this sealing glass material is lower than 65.0% by weight, crystallization of the glass is advanced and air-tight sealing of the insulating vessel 3 is difficult. If the content of silica exceeds 80% by weight, the thermal expansion of the glass becomes small and is not in agreement with that of the insulating substrate 1 and lid member 2.

If the content of boron oxide (B$_2$O$_3$) is lower than 10.0% by weight, crystallization of the glass is advanced and air-tight sealing of the insulating vessel 3 is difficult. If the content of boron oxide exceeds 25.0% by weight, the chemical resistance of the glass is degraded and the reliability of air-tight sealing of the insulating vessel 3 is drastically reduced.

If the content of alumina (Al$_2$O$_3$) is lower than 1.0% by weight, the chemical resistance of the glass is degraded and the reliability of air-tight sealing of the insulating vessel 3 is drastically reduced. If the content of alumina exceeds 10.0% by weight, the thermal expansion of the glass becomes small and is not in agreement with that of the insulating substrate 1 and lid member 2.

If the content of the oxide of sodium or potassium is lower than 1.0% by weight, when the glass is prepared, the melting temperature of the glass is drastically elevated and the operation adaptability is reduced. If the content of the oxide of sodium or potassium exceeds 10.0% by weight, the chemical resistance of the glass is degraded and the reliability of air-tight sealing of the insulating vessel 3 is drastically reduced.

In the semiconductor element container package of the present invention, by forming an external lead terminal for connecting a semiconductor element to an external circuit by using an electroconductive material having an electron-conductivity of at least 10% (IACS) and a thermal expansion coefficient of $5\times 10^{-6}$ to $12\times 10^{-6}/°C$.

The signal-transmitting speed of the external lead terminal can be much increased, and even if the semiconductor element is driven at a high speed, transfer and transmission of the signal between the semiconductor element and the external electric circuit can always be performed stably and assuredly.

Moreover, even if the line width of the external lead terminal is reduced, the electric resistance of the external lead terminal can be controlled to a low level. Accordingly, the attenuation of a signal in the external lead terminal can be controlled to a lowest level and an electric signal supplied from the external electric circuit can be precisely put into the semiconductor element contained in the interior.

Still further, since the thermal expansion coefficient of the external lead terminal is close to those of the insulating substrate, lid member and sealing glass material member, even if the external lead terminal is gripped between the insulating substrate and lid member and they are bonded together through the sealing glass material member, any thermal stress is generated between the insulating substrate and lid member and the sealing glass material member or between the external lead terminal and the sealing glass material member, and these members can be tightly attached and bonded to one another.

We claim:

1. A container package for a semiconductor element, the package comprising:
    (a) a vessel having in the interior thereof a space for containing a semiconductor element, the vessel comprising an insulating substrate and a lid member;
    (b) an external lead terminal for connecting the semiconductor element contained in the vessel to an electric circuit; and
    (c) a sealing agent for sealing the vessel and the external lead terminal, wherein the external lead terminal is composed of a metal body comprising a core composed of copper; the outer surface of the core being clad with a cladding layer composed of an alloy comprising 51.5 to 52.5% by weight of nickel and 47.5 to 48.5% by weight of iron; the sectional area of the cladding layer being 7.2 to 8.8 times as large as the sectional area of the core; and the metal body having a thermal expansion coefficient of from $5\times 10^{-6}$ to $12\times 10^{-6}/°C$. and an electroconductivity of at least 10% (International Annealed Copper Standard).

2. A package as set forth in claim 1, wherein the insulating substrate and the lid member are composed of a forsterite sintered body or a zirconia sintered body.

3. A semiconductor element container package as set forth in claim 2, wherein the sealing agent consists of a glass formed by adding up to 15% by volume of at least one member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

4. A package as set forth in claim 1, wherein the insulating substrate and the lid member are composed of at least one member selected from an aluminum nitride sintered body, a mullite sintered body and a zircon sintered body.

5. A semiconductor element container package as set forth in claim 4, wherein the sealing agent consists of a glass formed by adding 30.0 to 50.0% by volume of at least member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

6. A package as set forth in claim 1, wherein the insulating substrate and the lid member are composed of an aluminum oxide sintered body.

7. A package as set forth in claim 6, wherein the sintered body has a thermal expansion coefficient of from $65\times 10^{-7}$ to $75\times 10^{-7}/°C$.

8. A semiconductor element container package as set forth in claim 6, wherein the sealing agent consists of a glass formed by adding 20 to 40% by volume of at least one member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

* * * * *